(12) United States Patent
Fulford et al.

(10) Patent No.: US 6,300,205 B1
(45) Date of Patent: Oct. 9, 2001

(54) METHOD OF MAKING A SEMICONDUCTOR DEVICE WITH SELF-ALIGNED ACTIVE, LIGHTLY-DOPED DRAIN, AND HALO REGIONS

(75) Inventors: H. Jim Fulford, Austin; Jon Cheek, Round Rock; Derick J. Wristers; James Buller, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/193,262

(22) Filed: Nov. 18, 1998

(51) Int. Cl.[7] ................................................. H01L 21/336
(52) U.S. Cl. ........................ 438/303; 438/302; 438/305; 438/306; 438/525
(58) Field of Search ..................................... 438/199, 302, 438/286, 305, 528, 303, 304, 306, 307, 525, 549

(56) References Cited

U.S. PATENT DOCUMENTS

| | | | |
|---|---|---|---|
| 5,578,509 | 11/1996 | Fujita | 438/302 |
| 5,595,919 | 1/1997 | Pan | 438/286 |
| 5,736,446 | 4/1998 | Wu | 438/305 |
| 5,830,788 | 11/1998 | Hiroki et al. | 438/199 |
| 5,885,886 | 3/1999 | Lee | 438/528 |

OTHER PUBLICATIONS

F. T. Liou et al., "A 0.8UM CMOS Technology for High Performance Asic Memory and Channelless Gate Array", *Custom Integrated Circuits Conference*, pp. 25.2.1–25.2.4 (1988).
Wolf, *Silicon Processing for the VLSI Era*, Lattice Press, vol. 2: Process Integration, pp. 354–363 (1990).
Wolf, *Silicon Processing for the VLSI Era*, Lattice Press, vol. 3, The Submicron MOSFET, pp. 232–240, (1995).
Wolf, *Silicon Processing for the VLSI Era*, Lattice Press, vol. 3, The Submicron MOSFET, pp. 309–311, (1995).
Wolf, *Silicon Processing for the VLSI Era*, Lattice Press, vol. 3, The Submicron MOSFET, pp. 621–622, (1995).

*Primary Examiner*—Eddie Lee
*Assistant Examiner*—José R Diaz

(57) ABSTRACT

One method of making a semiconductor device includes forming a gate electrode on a substrate and forming a spacer on a sidewall of the gate electrode. An active region is then formed in the substrate and adjacent to the spacer, but spaced apart from the gate electrode, using a first dopant material. A halo region is formed in the substrate under the spacer and adjacent to the active region using a second dopant material of a conductivity type different than the first dopant material. The halo region may be formed by implanting the second dopant region into the substrate at an angle substantially less than 90° relative to a surface of the substrate. A portion of the spacer is then removed and a lightly-doped region is formed in the substrate adjacent to the active region and the gate electrode and shallower than the halo region using a third dopant material of a same conductivity type as the first dopant material.

23 Claims, 7 Drawing Sheets

METHOD OF MAKING A SEMICONDUCTOR DEVICE WITH SELF-ALIGNED ACTIVE, LIGHTLY-DOPED DRAIN, AND HALO REGIONS

FIELD OF THE INVENTION

The present invention is directed to semiconductor devices and method of making these devices. In particular, the present invention is directed to semiconductor devices having a halo region below a lightly-doped drain region and adjacent to an active region and methods of making these devices.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent to the gate electrodes by heavily doping the regions with a dopant material of a desired conductivity. The conductivity of the doped region depends on the type and concentration of the impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly-doped with a dopant material. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between transverse electric field is set up in the channel region. By varying the transverse electric field, it is possible to modulate the conductance of the channel region between the source and drain regions. In this manner, an electric field is used to control the current flow through the channel region. This type of device is commonly referred to as a MOS field-effect-transistor (MOSFET).

MOS devices typically fall in one of two groups depending on the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A number of different techniques and fabrication processes may be used to form MOS devices. With reference to FIGS. 1A–1E, one typical MOS fabrication process is depicted to form semiconductor structures with source/drain structures having heavily-doped regions and adjacent lightly-doped regions commonly referred to as lightly-doped drain (LDD) regions. LDD structures are often used in the formation of semiconductor devices having short channels to prevent or reduce short-channel effects.

As depicted in FIG. 1A, a gate electrode 103 is formed on a substrate 101. An LDD region 115 is formed in the substrate 101 by implanting a relatively low dose of a dopant material 110 into the exposed areas, as illustrated in FIG. 1B. Following the LDD implant, a spacer layer 116 is formed and etched to form spacers 117 on sidewalls of the gate electrode 103, as illustrated in FIGS. 1C and 1D. The substrate 101 is again implanted with a heavy dose of dopant material 120 aligned with the spacers 117 to form heavily-doped regions 118, which together with the LDD regions 115, form LDD source/drain structures 119, as illustrated in FIG. 1E. Following formation of the LDD structures 119, further processing such as silicidation and interconnect formation is performed. A more detailed description of the elements and fabrication of source/drain structures may be found in S. Wolf, *Silicon Processing for the VLSI Era,* Vol. 2: Processing Integration, pp. 354–363.

As semiconductor devices become smaller, the channel length becomes shorter. One problem of short channel junctions is punchthrough of carriers across the channel region from one heavily-doped region to the other in the absence of a gate current. Punchthrough typically occurs due to the merging of source and drain depletion areas. A variety of punchthrough implant techniques have been developed to overcome this problem. These include providing a punchthrough implant in the channel region prior to formation of the gate electrode. An alternative method includes forming a halo region adjacent to the heavily-doped regions of the source/drain structures and below the LDD region using, for example, an angled implant of a dopant material having a different conductivity type than that of the heavily-doped regions and LDD regions. This halo region is typically formed after the heavily-doped and LDD regions. See, for example, S. Wolf, *Silicon Processing for the VLSI Era,* Vol. 3: The Submicron MOSFET, pp. 238–240, 309–311, and 621–22. As semiconductor devices become smaller, there is a need for methods that provide for greater precision in the alignment of structures in a device, including the heavily-doped, LDD, and halo regions, to ensure accurate and reproducible device structures.

SUMMARY OF THE INVENTION

Generally, the present invention relates to the formation of semiconductor devices having heavily-doped active, LDD, and halo regions, including, at least in some instances, the self-aligned formation of heavily-doped active, LDD, and halo regions. One method of making a semiconductor device includes forming a gate electrode on a substrate and forming a spacer on a sidewall of the gate electrode. An active region is then formed in the substrate and adjacent to the spacer, but spaced apart from the gate electrode, using a first dopant material. A halo region is formed in the substrate under the spacer and adjacent to the active region using a second dopant material of a conductivity type different than the first dopant material. The halo region may be formed by implanting the second dopant region into the substrate at an angle substantially less than 90° relative to a surface of the substrate. A portion of the spacer is then removed and a lightly-doped region is formed in the substrate adjacent to the active region and the gate electrode and shallower than the halo region using a third dopant material of a same conductivity type as the first dopant material.

A semiconductor device includes a substrate and a gate electrode disposed over the substrate. A lightly-doped region is provided in the substrate adjacent to the gate electrode and an active region is provided in the substrate adjacent to the lightly-doped region and spaced apart from the gate electrode. A halo region is provided in the substrate below the lightly-doped region and adjacent to the active region. The halo region is formed using a dopant material of a conductivity type different than the dopant material of the active region and includes an upturned portion that is spaced apart from the active region.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
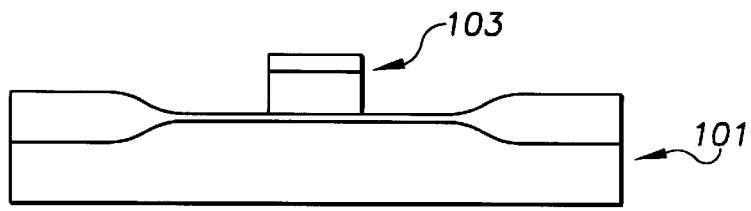
FIGS. 1A through 1E illustrate a conventional process for forming a semiconductor device.
Figure 1B:
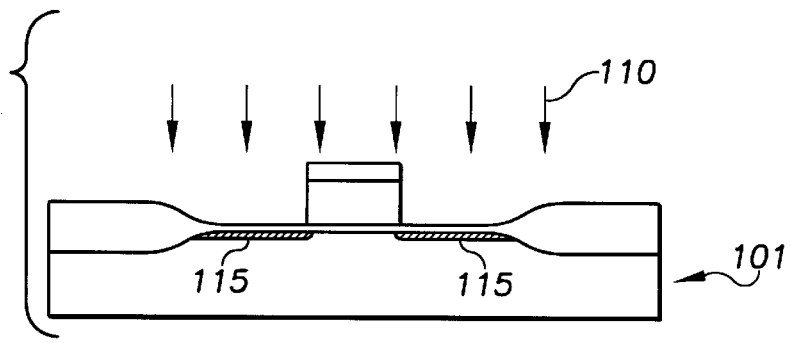
Figure 1C:
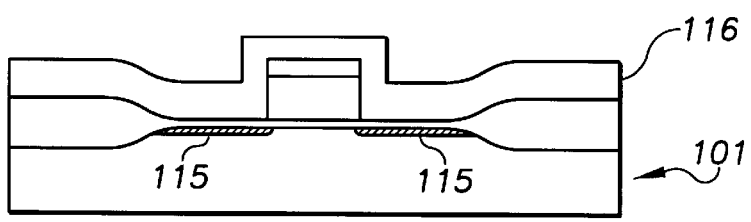
Figure 1D:
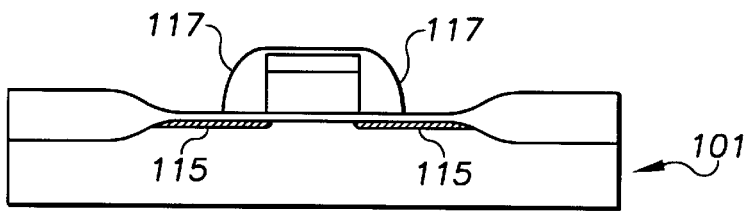
Figure 1E:
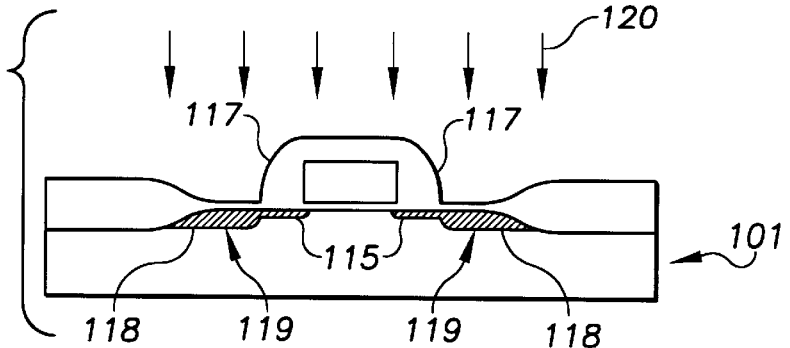

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to semiconductor devices and their formation. The invention is particularly suited to the formation of semiconductor devices with self-aligned active, LDD (lightly-doped drain), and halo regions. While the present invention is not so limited, an appreciation of various aspects of the invention will be gained through a discussion of the various application examples operating in such environments.

Figure 2A:
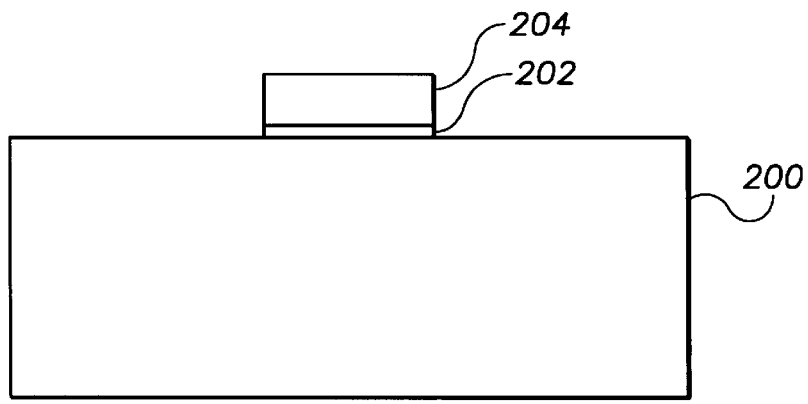
FIGS. 2A through 2G illustrate an exemplary fabrication process for forming a device in accordance with one embodiment of the invention.

FIGS. 2A through 2G illustrate one example of a method for forming a semiconductor device according to the invention. A gate electrode 204 is formed over a substrate 200 and a gate insulating layer 202, as shown in FIG. 2A. The substrate 200 is typically a semiconductor material and can be, for example, silicon. The gate insulating layer 202 can be made using a variety of dielectric materials including, for example, silicon dioxide ($SiO_2$) and silicon oxynitride ($SiO_xN_y$). Other dielectric materials may be used for the insulating layer. The gate insulating layer can be made by a variety of methods including, for example, thermal oxidation of the substrate 200 in an inert, oxygen-, or nitrogen-bearing (e.g., NO or $N_2O$) ambient, chemical vapor deposition (CVD) of a dielectric material (e.g., tetraethyl orthosilicate (TEOS)), or physical vapor deposition. The thickness of the gate insulating layer 202 typically ranges from, for example, 15 to 200 angstroms; however, thinner or thicker gate insulating layers can be used.

The gate electrode 204 can be formed using a variety of materials including, for example, metals (e.g., aluminum, copper, tungsten, and titanium) or polysilicon. A polysilicon first electrode may be particularly useful if later processing procedures include high temperatures that could damage a metal structure. A variety of methods for formation of metal and polysilicon gate electrodes are known and may be used.

Figure 2B:
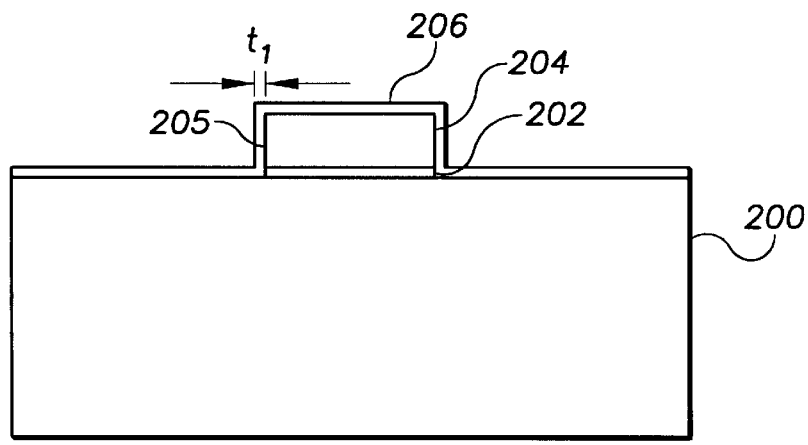

After formation of the gate electrode 204, a first spacer layer 206 is formed over the gate electrode 204 and substrate 200, as shown in FIG. 2B. In particular, the first spacer layer 206 is disposed against at least one sidewall 205 of the gate electrode. The first spacer layer 206 is typically formed using a dielectric material, such as, for example, an oxide material, e.g., silicon dioxide. Other dielectric materials can also be used. The first spacer layer 206 can be formed by a variety of techniques, including, for example, chemical vapor deposition, physical vapor deposition, and thermal oxidation (if the gate electrode 204 is formed of polysilicon).

The thickness, $t_1$, of the first spacer layer 206 may determine, at least in part, the dopant distribution of an LDD region formed in the substrate adjacent to the gate electrode, thus, the thickness of the first spacer layer may be selected based on a desired LDD region structure. The thickness, $t_1$, (extending from the gate electrode) of the first spacer layer 206 can be in the range of, for example, 50 to 150 Angstroms, although larger or smaller first spacer layers may be used.

Figure 2C:
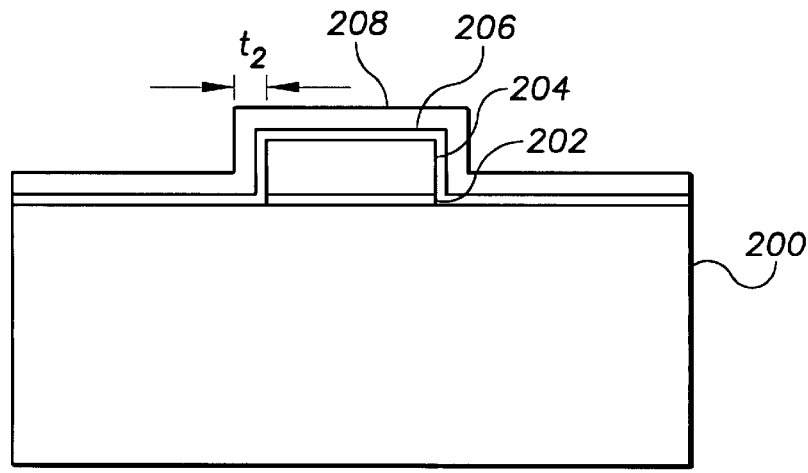

A second spacer layer 208 is formed over the first spacer layer 206, as shown in FIG. 2C. The second spacer layer 208 is typically formed of a material that can be selectively etched with respect to the material of the first spacer layer 206. For example, if the first spacer layer 206 is formed using silicon dioxide, the second spacer layer 208 can be formed using silicon nitride. Other combinations for the first and second spacer layers 206, 208 can be used. The second spacer layer 208 can be formed by a variety of techniques, including, for example, chemical vapor deposition and physical vapor deposition.

The combined thicknesses of the first and second spacer layers may determine, at least in part, the separation of a heavily doped active region formed in the substrate from the gate electrode. In addition, the thickness of the second spacer layer may determine, at least in part, the size of a lightly-doped region formed in the substrate between the active region and the gate electrode. The thickness of the second spacer layer is selected in view of these considerations. The thickness, $t_2$, (extending from the first spacer layer) of the second spacer layer 208 can be in the range of, for example, 150 to 400 Angstroms, although larger or smaller second spacer layers may be used.

Figure 2D:
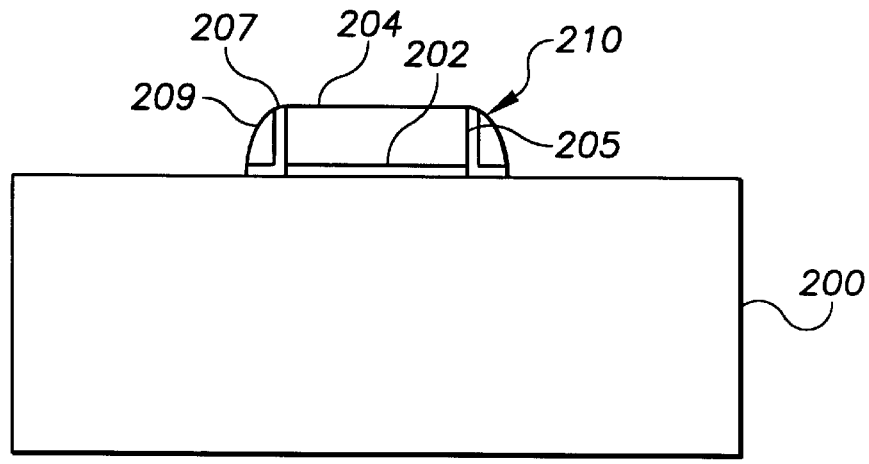

After formation of the first and second spacer layers 206, 208, a portion of these layers 206, 208 is removed to form spacer structures 210 with first and second spacers 207, 209 on the sidewalls 205 of the gate electrode 204, as illustrated in FIG. 2D. The first and second spacers 207, 209 can be formed from the first and second spacer layers 206, 208 by a variety of etching techniques, including, for example, anisotropic etching. This technique typically includes the removal of portions of the first and second spacer layers 206, 208 disposed horizontally over the gate electrode 204 and the substrate 200, leaving vertical portions disposed on the sidewalls 205 of the gate electrode 204. The removal of portions of the first and second spacer layers 206, 208 can be performed simultaneously or in separate steps for the two layers 206, 208. In some embodiments, a portion of the first spacer layer 206 (typically less than 50 Angstroms) is left over the horizontal regions of the gate electrode and the substrate as a protective layer, particularly if the first spacer layer 206 is formed of silicon dioxide.

Figure 2E:
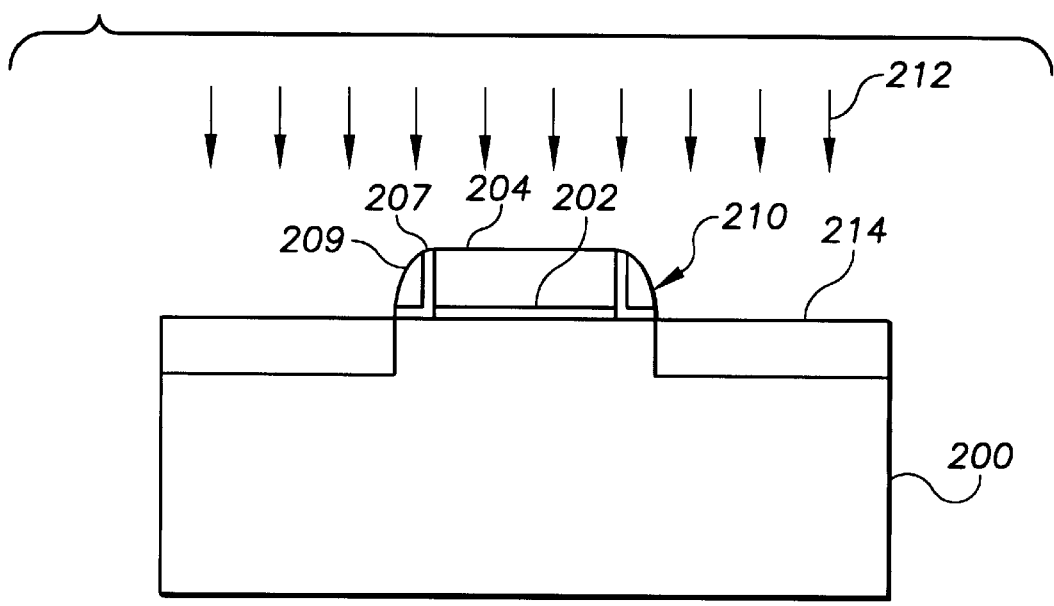

A first dopant material 212 is then implanted in the substrate 200 to form active regions 214 that are spaced apart from the gate electrode 204 by the spacer structures 210, as shown in FIG. 2E. The first dopant material 212 can be a p-type dopant, such as, for example, boron, boron hydride, or a boron halide, or an n-type dopant, such as, for example, phosphorus or arsenic. The choice of the first dopant material depends on the type (NMOS or PMOS) of MOS device being formed. The implant energies of the first dopant material 212 can be in the range of, for example, 5 to 30 keV and the dopant dosage can be in the range of, for example, 5E14 ($5 \times 10^{14}$) dopant atoms/cm$^2$ to 5E15 ($5 \times 10^{15}$) dopant atoms/cm$^2$, although higher or lower implant energies and dopant dosages may be used.

The partially fabricated device may be annealed after forming the active regions 214 using, for example, rapid thermal anneal (RTA) techniques. This activates the dopant material in the active regions 214 and may drive the dopant material deeper into the substrate 200 and provide a more uniform distribution of the dopant material. This may also cause some lateral diffusion of the dopant material. The temperature to which the substrate 200 is heated typically ranges from, for example, 800 to 950° C. for periods of time ranging from, for example, 30 to 60 seconds. This anneal process may be performed at any time in the process after the implantation of the first dopant material. In addition, anneal processes may be used for each of the second and third dopant materials described below. In some instances, a single anneal process may be used after the implanting two or more different dopant materials to activate the two or more different dopant materials.

Figure 2F:
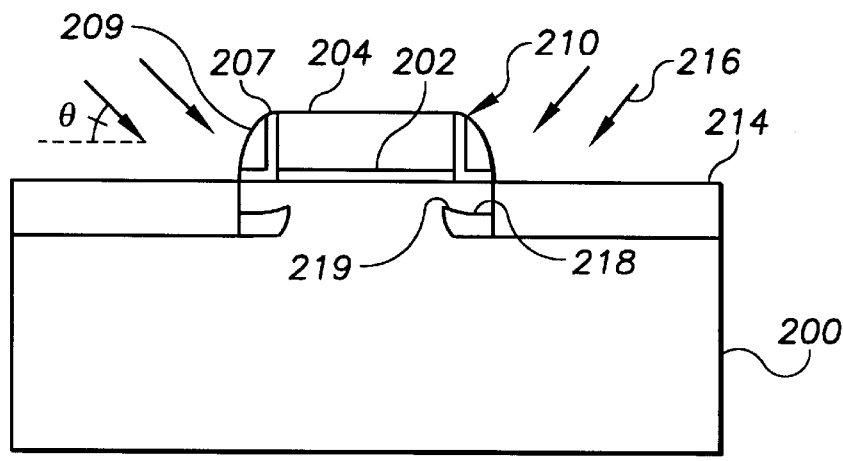

After the formation of the active regions 214, a second dopant material 216 is implanted at an angle, θ, to form halo regions 218 adjacent to a lower portion of the active regions 214, and below the spacer structures 210, as shown in FIG. 2F. The halo regions 218 are formed deeper in the substrate 200 than subsequently formed LDD regions. The second dopant material 216 is of a conductivity type different than that of the first dopant material 212 (i.e., if the first dopant material is p-type than the second dopant material is n-type). In alternative embodiments, the second dopant material may be implanted prior to the first dopant material.

The implant energies of the second dopant material 216 can be in the range of, for example, 5 to 40 keV and the dopant dosage can be in the range of, for example, 5E12 ($5 \times 10^{12}$) dopant atoms/cm$^2$ to 1E14 ($1 \times 10^{14}$) dopant atoms/cm$^2$, although higher or lower implant energies and dopant dosages may be used. The second dopant material 216 is typically implanted at an angle so that the dopant material can be implanted beneath the spacer structures 210. The angle, θ, of implantation is typically substantially less than 90° relative to the surface of the substrate and can be in the range of, for example, about 15 to 40 degrees relative to the surface of the substrate. The substrate is typically rotated during the implantation to provide symmetrical halo regions in the substrate. In some instances, implantation at an angle and through the spacer structures 210 results in an upturned section 219 of the halo regions 218 which may curve up and around a portion of the subsequently formed LDD region.

Figure 2G:
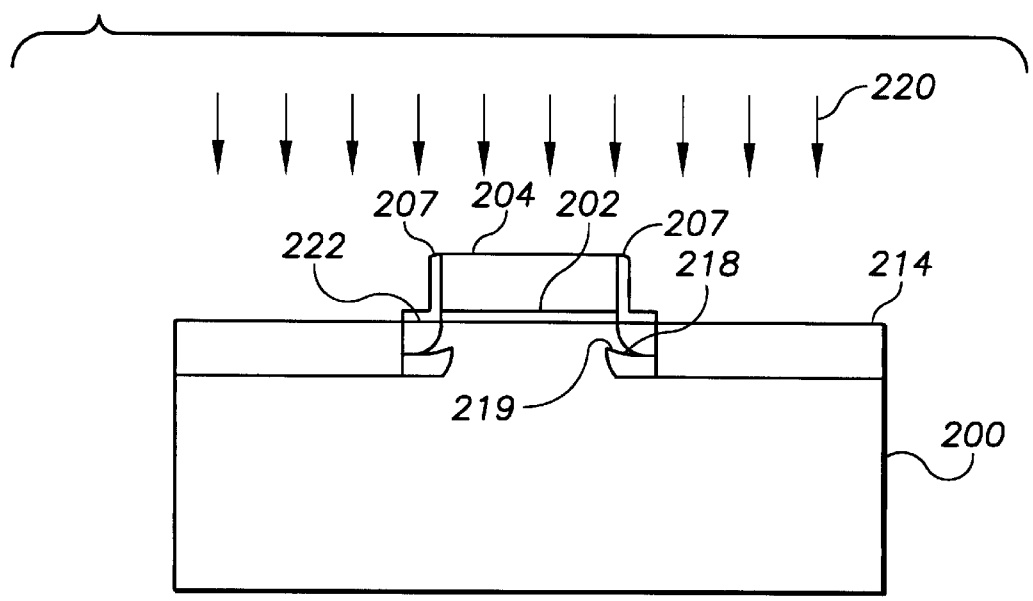

The second spacers 209 are then removed, as illustrated in FIG. 2G. The second spacers 209 can be removed by a variety of techniques, including selectively etching the second spacers 209 leaving the first spacers 207. Typically, the second spacers 209 are formed from a material, such as silicon nitride, that can be selectively etched with respect to the material (e.g., silicon dioxide) of the first spacers 207. This typically leaves thin first spacers 207. If a thinner spacers are desired, the first spacers 207 can be etched to remove a portion of its material. For example a silicon dioxide first spacer 207 could be dipped in an etchant, such as HF, to etch the spacer thickness to 50 Angstroms or less. In some cases, the entire first spacer 207 may be removed.

After removal of the second spacers 209 and optional thinning or removal of the first spacers 207, a third dopant material 220 is implanted into the substrate 200 to form LDD regions 222 adjacent to the gate electrode 204 and active regions 214 and above the halo regions 218, as shown in FIG. 2G. The third dopant material 220 is of the same conductivity type, although not necessarily the same material, as the first dopant material 212. The implant energies of the third dopant material 220 can be in the range of, for example, 5 to 25 keV and the dopant dosage can be in the range of, for example, 1E13 ($1 \times 10^{13}$) dopant atoms/cm$^2$ to 5E14 ($5 \times 10^{14}$) dopant atoms/cm$^2$, although higher or lower implant energies and dopant dosages may be used. Additional processing steps, including, for example, reformation or enlargement of the spacer, silicidation, interconnect formation, and so forth may be performed to complete the ultimate device structure.

Using the method illustrated in FIGS. 2A–2G, active regions 214, halo regions 218, and LDD regions 222 are formed using a self-aligned process that includes a spacer structure 210. This self-aligned process can often produce semiconductor devices with greater uniformity than those formed by conventional techniques.

Figure 3A:
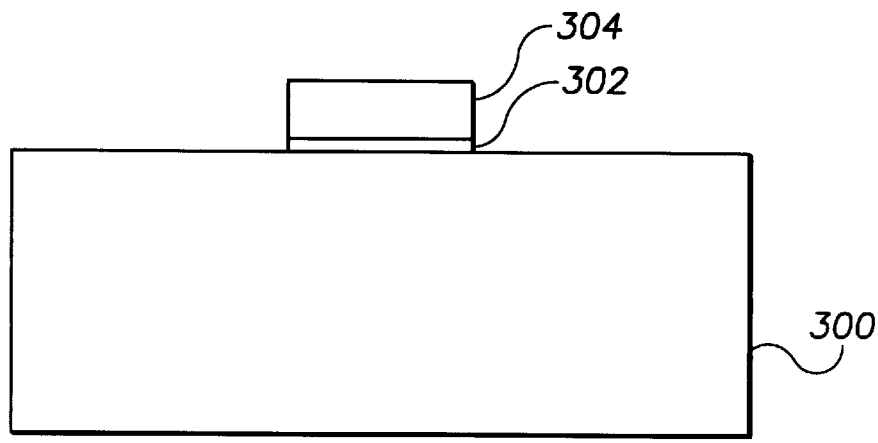
FIGS. 3A through 3F illustrate an exemplary fabrication process for forming a device in accordance with another embodiment of the invention.
Figure 3B:
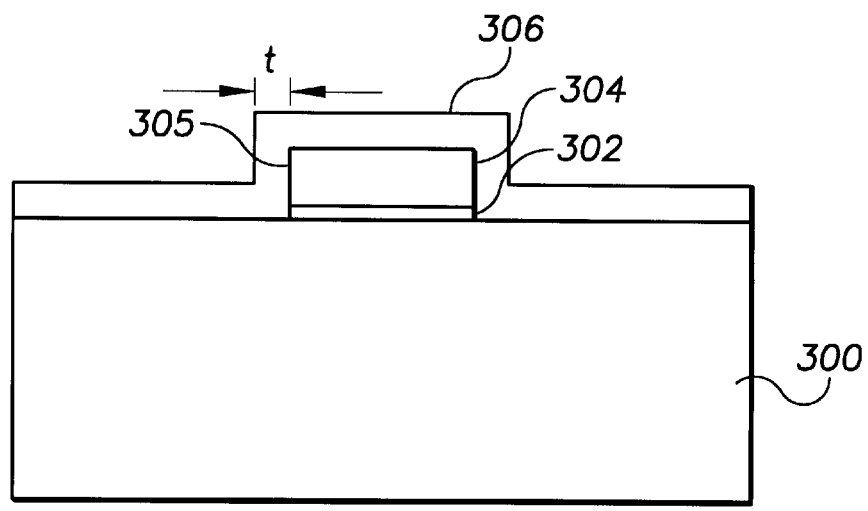
Figure 3C:
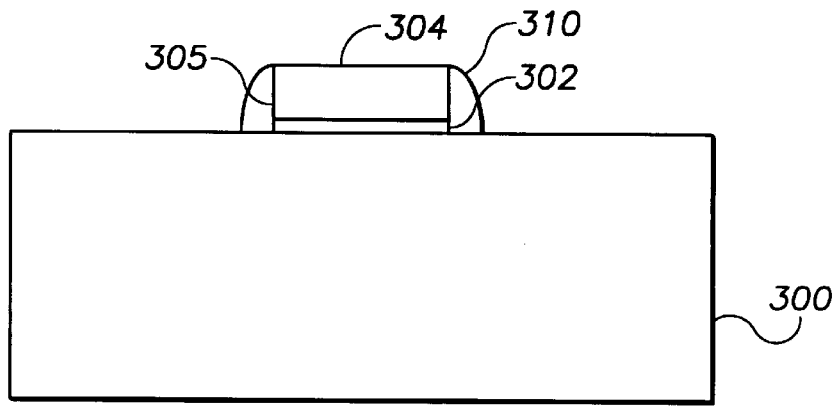
Figure 3D:
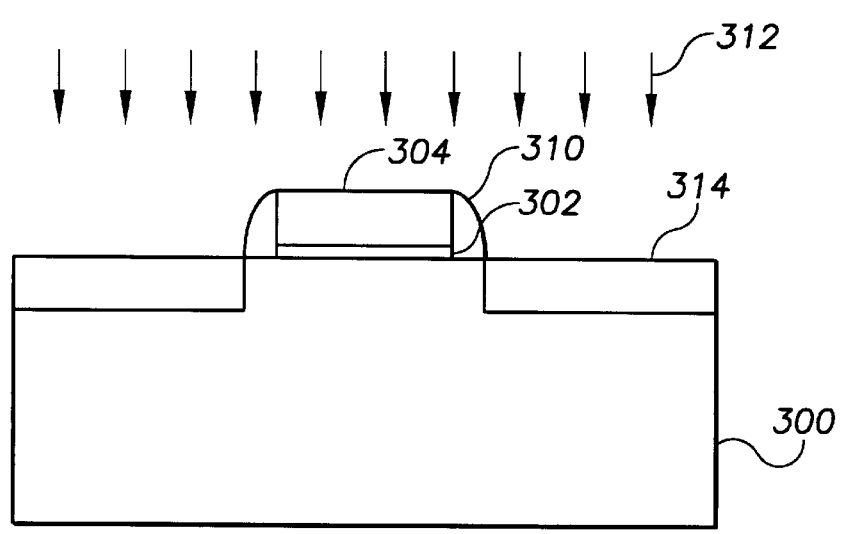
Figure 3E:
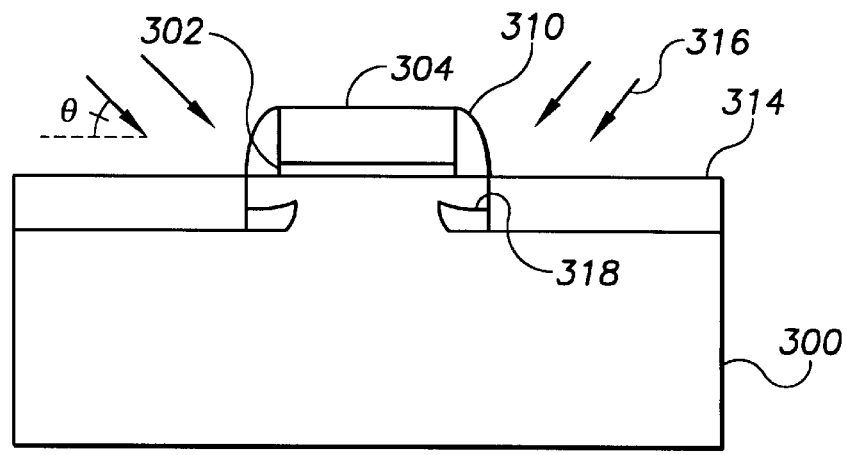
Figure 3F:
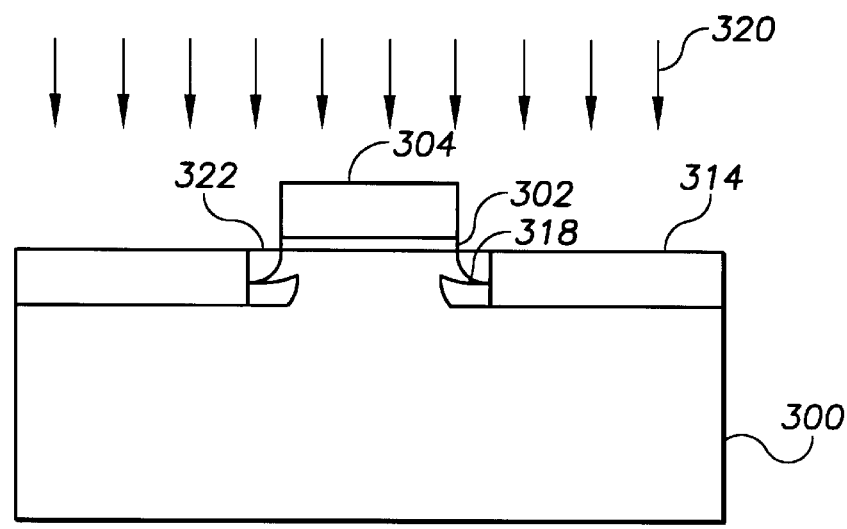

Another method of forming a semiconductor device with self-aligned active, halo, and LDD regions is illustrated in FIGS. 3A through 3F. The processing materials and conditions are the same as those described with respect to FIGS. 2A through 2G except as noted below. This method includes forming a gate insulating layer 302 and gate electrode 304 on a substrate 300, as shown in FIG. 3A, and then forming a spacer layer 306 over the substrate 300 and against the sidewalls 305 of the gate electrode 304, as shown in FIG. 3B. The spacer layer 306 is typically formed of silicon dioxide, silicon oxynitride, or another dielectric material and at a thickness, t, (extending from the gate electrode) that is, for example, 200 to 500 Angstroms. Spacer structures 310 are formed from the spacer layer 306, as shown in FIG. 3C, and then active regions 314 are formed in the substrate 300 by implanting a dopant material 312 using the spacer structures 310 as a mask, as shown in FIG. 3D. Halo regions 318 are formed by implanting a second dopant material 316 into the substrate 300 at an angle, θ, as shown in FIG. 3E. The spacer structures 310 are then removed either completely or leaving only a thin (e.g., 50 Angstroms or less) portion of the spacer structures and LDD regions 322 are then formed by implantation of the third dopant material 320 into the substrate 300, as shown in FIG. 3F.

Optionally, a halo region may be selectively formed on one side of the gate electrode by masking off the other side using, for example, a layer of dielectric material. In addition, CMOS devices can be formed by a variety of techniques that utilize masking (e.g., masking with a dielectric or photoresist layer). For example, PMOS and NMOS portions of the CMOS device can be formed independently (e.g., forming PMOS portions, masking the PMOS portions, and then forming the NMOS portions) or they can be formed simultaneously, except that one portion is masked during the implantation of a particular dopant material in the other portion (e.g., the PMOS portions are masked during implant of the first, second, or third dopant material in the NMOS portion and then the NMOS portion is masked during implant of the first, second, or third dopant material in the PMOS portion.)

As noted above, the present invention is applicable to a number of different devices and systems that include a halo region to prevent or reduce punchthrough between active regions. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A method of making a semiconductor device, comprising:
   forming a gate electrode on a substrate;
   forming a spacer on a sidewall of the gate electrode;
   forming an active region, using a first dopant material, in the substrate adjacent to the spacer and spaced apart from the gate electrode;
   forming a halo region, using a second dopant material of a conductivity type different than the first dopant material, in the substrate under the spacer and adjacent to the active region;
   removing at least a portion of the spacer; and
   forming a lightly-doped region, using a third dopant material of a same conductivity type as the first dopant material, in the substrate adjacent to the active region and the gate electrode and shallower than the halo region.

2. The method of claim 1, wherein forming a spacer comprises:
   forming a first spacer adjacent to the sidewall of the gate electrode; and
   forming a second spacer adjacent to the first spacer.

3. The method of claim 2, wherein the first spacer comprises an oxide material.

4. The method of claim 2, wherein the second spacer comprises a nitride material.

5. The method of claim 2, wherein removing at least a portion of the spacer comprises selectively removing the second spacer.

6. The method of claim 5, wherein removing at least a portion of the spacer further comprises removing a portion of the first spacer.

7. The method of claim 2, wherein removing at least a portion of the spacer comprises removing all of the spacer.

8. The method of claim 1, wherein removing at least a portion of the spacer comprises removing all of the spacer.

9. The method of claim 1, wherein forming a halo region comprises implanting the second dopant material into the substrate and adjacent to a lower portion of the active region to form the halo region.

10. The method of claim 1, wherein forming a halo region comprises implanting the second dopant material at an angle substantially less than 90° relative to a surface of the substrate to form the halo region.

11. The method of claim 10, further comprising rotating the substrate while implanting the second dopant material.

12. The method of claim 1, wherein forming a halo region comprises implanting the second dopant material at an angle in a range of 15 to 40 degrees relative to a surface of the substrate.

13. The method of claim 1, wherein forming the halo region further comprises forming an upturned portion of the halo region spaced apart from the active region by implanting the second dopant material under the spacer and at an angle substantially less than 90 degrees relative to a surface of the substrate.

14. The method of claim 1, wherein the first and third dopant materials comprise a p-type dopant material and the second dopant material comprises an n-type dopant material.

15. The method of claim 1, wherein the first and third dopant materials comprise an n-type dopant material and the second dopant material comprises a p-type dopant material.

16. The method of claim 1, wherein the halo region is formed subsequent to the active region.

17. The method of claim 1, wherein forming a halo region includes forming the halo region before removing at least a portion of the spacer.

18. The method of claim 17, wherein forming a halo region includes implanting dopant through the spacer to form a portion of the halo region that extends vertically closer to the gate region than a portion of the halo region immediately adjacent the active region.

19. The method of claim 17, wherein forming a lightly-doped region includes forming a lightly-doped region after removing at least a portion of the spacer.

20. A method of making a semiconductor device, comprising:
   forming a gate electrode on a substrate;
   forming a first spacer adjacent to a sidewall of the gate electrode;
   forming a second spacer adjacent to the first spacer;
   implanting a first dopant material in the substrate to form an active region adjacent to the second spacer and spaced apart from the gate electrode;
   implanting a second dopant material in the substrate at an angle substantially less than 90° relative to a surface of the substrate to form a halo region under the first and second spacers and adjacent to a lower portion of the active region, wherein the second dopant material is of a conductivity type different than the first dopant material;
   selectively removing the second spacer; and
   implanting a third dopant material in the substrate after selectively removing the second spacer to form a lightly-doped region adjacent to the active region and the gate electrode and above the halo region.

21. The method of claim 20, further comprising removing at least a portion of the first spacer prior to implanting the third dopant material.

22. The method of claim 20, wherein the first dopant material is implanted prior to the second dopant material.

23. The method of claim 20, wherein implanting a second dopant material to form a halo region includes implanting dopant material through at least one of: the first and second spacers.

* * * * *

UNITED STATES PATENT AND TRADEMARK OFFICE
CERTIFICATE OF CORRECTION

PATENT NO.     : 6,300,205 B1  
DATED          : October 9, 2001  
INVENTOR(S)    : Fulford et al.

Page 1 of 1

It is certified that error appears in the above-identified patent and that said Letters Patent is hereby corrected as shown below:

<u>Column 6,</u>  
Line 15, after "If", please delete "a".

Signed and Sealed this

Nineteenth Day of March, 2002

Attest:

JAMES E. ROGAN  
*Director of the United States Patent and Trademark Office*

*Attesting Officer*